United States Patent [19]

Seike et al.

[11] Patent Number: 5,359,149

[45] Date of Patent: Oct. 25, 1994

[54] SUPERCONDUCTIVE DEVICE FOR HELPING SHIELD MAGNETIC FIELD

[75] Inventors: Shoji Seike; Hideki Shimizu, both of Nagoya; Makoto Tani, Inazawa, all of Japan

[73] Assignee: NGK Insulators, Ltd., Nagoya, Japan

[21] Appl. No.: 803,940

[22] Filed: Dec. 9, 1991

[30] Foreign Application Priority Data

Dec. 8, 1990 [JP] Japan .................... 2-407265

[51] Int. Cl.⁵ .................... H05K 9/00; H01L 39/00; H04B 3/28
[52] U.S. Cl. .................... 505/213; 505/1; 505/872; 505/706; 505/234; 505/220; 174/125.1; 174/35 R
[58] Field of Search ............. 174/35 R, 35 MS, 125.1; 505/1, 843, 844, 845, 846, 875, 701, 706, 818; 29/599

[56] References Cited

U.S. PATENT DOCUMENTS

| 3,895,432 | 7/1975 | Diepers et al. | 29/599 |
| 5,061,685 | 10/1991 | Kosuge et al. | 505/1 |

FOREIGN PATENT DOCUMENTS

| 0390517A2 | 10/1990 | European Pat. Off. |
| 0488717A1 | 6/1992 | European Pat. Off. |
| 3905424A1 | 8/1990 | Fed. Rep. of Germany |

Primary Examiner—Leo P. Picard
Assistant Examiner—Bot Ledynh
Attorney, Agent, or Firm—Adduci, Mastriani, Schaumberg & Schill

[57] ABSTRACT

A superconductive device for helping shield magnetic field comprises at least two members; a layer containing superconductive oxide over each of the members; connecting component for connecting the members to form a substrate; and connecting element for connecting the layers containing superconductive oxide along a joint in which the members are connected.

19 Claims, 11 Drawing Sheets

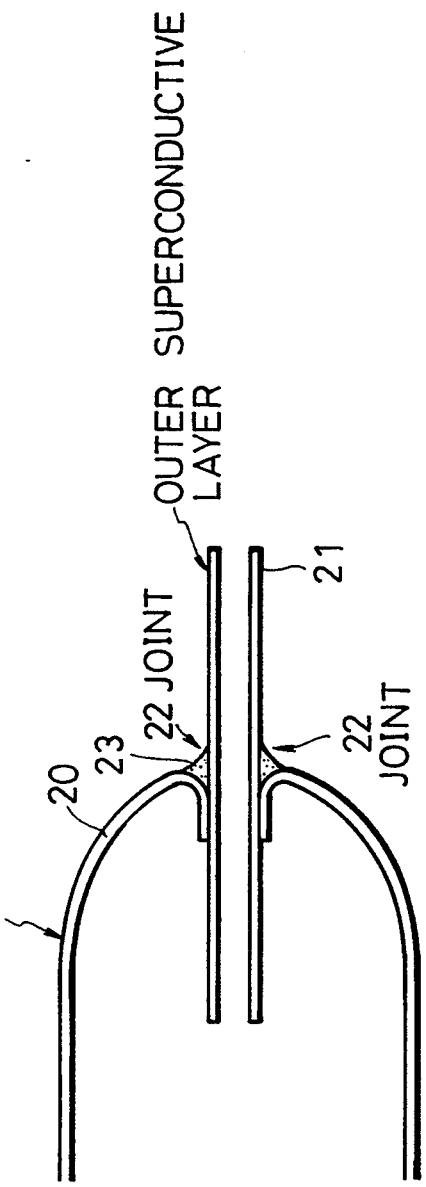
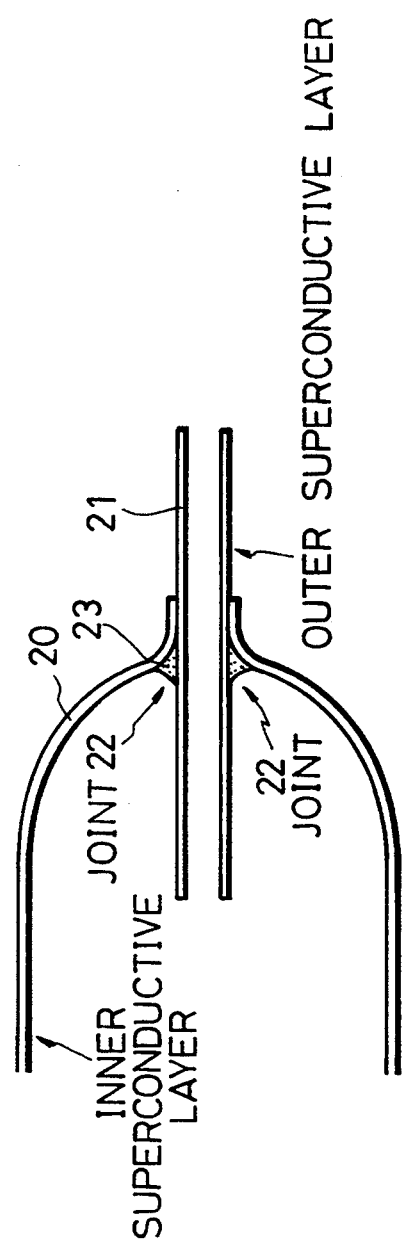

SUPERCONDUCTIVE DEVICE FOR HELPING SHIELD MAGNETIC FIELD

BACKGROUND OF THE INVENTION AND DESCRIPTION OF THE RELATED ART

The present invention relates to a superconductive device for helping shield magnetic field as well as to a method for manufacturing such a superconductive device.

Ferromagnetic materials such as permalloy or ferrite has been utilized to reduce the effects of magnetic field into that of a certain space. Currently many devices have been introduced to help shield magnetic field by Meissner effect of superconductors. For example, in Japanese Patent Laid Open No. 1-134998 (1989) superconductive materials are arranged to the innermost side of the space in which the magnetic field is shielded. In U.S. patent appliction Ser. No. 509,438 a superconducting magnetic shielding tube, i.e. a tube for shielding magnetic field, has been proposed by the present applicants that comprises at least two layers which include a layer of a substrate and a layer of superconductor arranged in this order from the magnetic source to be shielded.

As the structure of superconductive oxides becomes larger due to a demand of its application, it becomes more difficult to integrally form a structure of superconductive oxides and to form a homogeneous layer of superconductive oxide. Besides, it is not industrially preferable to enlarge the apparatus for manufacturing them. Therefore, the necessity is growing to prepare structures of superconductive oxide and combine them later.

However, a large device for helping shield magnetic field using superconductive oxide for actual practice has still remained in a developing stage at present mainly due to a problem in connecting layers of superconductive oxide. Magnetic field has been known to leak through joints in conventional methods of joining the layers, and high performance in shielding magnetic field cannot be achieved due to the leak.

SUMMARY OF THE INVENTION

An object of the present invention is to provide a large-scale superconductive device for helping shield magnetic field with excellent superconductive properties exerted by effectively connecting layers containing superconductive oxide as well as to a method of manufacturing such a superconductive device.

Another object of the present invention is to provide a superconductive device in a cylindrical tube helping shield magnetic field with satisfactory superconductive properties to shield the magnetic field inside itself from outside or vice versa.

One aspect of the present invention is to provide a superconductive device for helping shield magnetic field, comprising: at least two members; a layer containing superconductive oxide over each of said members; means for connecting said members to form a substrate; and means for connecting said layers containing superconductive oxide along a joint in which said members are connected.

Another aspect of the present invention is to provide superconductive device for helping shield magnetic field, comprising: at least two members; a layer containing superconductive oxide over each of said members; means for connecting said members to form a substrate; and at least one portion containing superconductive oxide that contacts with both sides of said layers containing superconductive oxide along a joint in which said members are connected.

Another object of the present invention is to provide a method for manufacturing a superconductive device for helping shield magnetic field comprising: a step of placing compounds to become a layer containing superconductive oxide over at least two members to form green members; a step of firing the green members to prepare members with a layer containing superconductive oxide; a step of connecting the members with a layer containing superconductive oxide into a substrate with a layer containing superconductive oxide by appropriate means; and a step of connecting the layers containing superconductive oxide over the substrate along a joint in which the members are connected.

BRIEF DESCRIPTION OF THE DRAWINGS

FIG. 9 to FIG. 11 show cross sections of a cylindrical tube with a bottom portion having a smaller cylindrical tube.

DETAILED DESCRIPTION OF THE INVENTION

Figure 1:
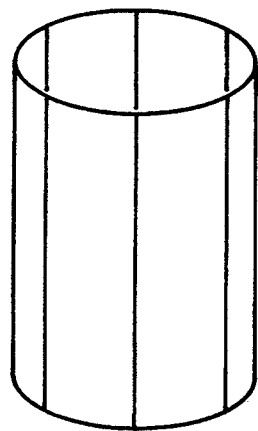
FIGS. 1 to 8 show explanatory views illustrating shapes of members, modes of combining members, and shapes of cylindrical tubes in the present invention.

The present invention is hereinafter described in detail.

The present invention resides in a superconductive device for helping shield magnetic field made of at least two members, with a layer containing superconductive oxide, connected along with the layers containing superconductive oxide over the members, as well as in a method for manufacturing such a device.

The present invention is characterized in a method that a layer containing superconductive oxide placed over a member is connected to the layer placed over an adjacent member connected to the former member such that magnetic field does not pierce through the joint in the resultant device.

In the device according to the present invention first at least two members with a layer containing superconductive oxide over each of the members is prepared. In some applications a layer containing superconductive oxide is directly placed on a member, while in others the layer is placed on an intermediate medium placed on a member. In either case a member includes a layer containing superconductive oxide, and such a member with a laminated structure is called a "laminated member."

A shape of the device of the present invention is not restricted and can be appropriately adjusted depending on its applications. The device of the present invention can take, for example, a planar form, a cylindrical tube, a rectangular shell, etc.

When the device of the present invention has a shape of a cylindrical tube, the device may shield the magnetic field inside itself from the perturbation outside; thus the magnetic field inside the device has low magnetic field. Alternatively, the device may shield the magnetic field inside having a source of strong magnetic field from affecting the field outside. Many times a superconductive device for helping shield magnetic field having a shape of a cylindrical tube is referred to herein as a cylindrical tube.

A cross section of a cylindrical tube is not limited to a circle but eclipse, truncated circle, triangle, rectangle, polygon, etc. are included. Likewise, the axis of a cylindrical tube is not restricted to be perpendicular to the top or the bottom plane of the cylindrical device to be formed. However, the axis of the cylindrical tube is preferred to be perpendicular to the bottom plane of itself.

Moreover, when the device of the present invention has a shape of a cylindrical tube, the device may have a bottom portion in a cylindrical tube open in some applications and may have it closed with a member or members protruding outside the device in other applications.

As material for a member, any may be used that has enough mechanical strength to support itself and numerous layers placed on it. For example, such ceramic materials as zirconia and titania as well as noble metals, alloys and such metals as stainless steel (SUS 430, SUS 310, and SUS 320, specified in JIS), Inconel, Incolloy, and hasteloy can be used. There is no restriction on the thickness of a substrate.

Then a layer containing superconductive oxide placed over a member is another essential ingredient in this invention. However, in many cases it is preferred to place the intermediate medium between a member and a layer containing superconductive oxide. First it works to prevent superconductive oxide from reacting with a metal used as a member. When a common metal or an alloy other than noble metals and a superconductive oxide are used as materials for a member and a superconductive oxide layer, respectively, the metal and the superconductive oxide react significantly during firing, resulting in poor performance in superconductivity in the final product. It is preferred to include at least one layer in the intermediate medium, for instance a noble metal layer, to prevent the reaction between the member and a layer containing superconductive oxide.

Moreover, it is also preferred that the intermediate medium have excellent adhesion onto the member over a wide range of temperatures from the sintering temperature of superconductive oxide to a cryogenic temperature, like that of liquid nitrogen. This function of adhesion can be attained by placing another layer for adhesion in the intermediate medium between the layer to prevent the reaction and the member; this adhesive layer is made out of such binding materials as glass, various kind of ceramics, metal pastes and noble metal pastes.

Furthermore, it is preferred that the intermediate medium can attain the foregoing functions and also act as a moderator to moderate thermal impact shocks exerted in cold/heat cycles when the tube is applied to repeated cycles between two drastically different temperatures such as cryogenic temperature and room temperature. In other words, in applications it is quite expected that the tube in the present invention undergoes drastic temperature changes in a short period of time; for example, a tube in the present invention is cooled down by liquid nitrogen to exert superconductive properties, and then the tube is left at room temperature.

Therefore, it is preferred that the intermediate medium includes another layer of glass as an adhesive layer placed on a member and contacted with a layer of a noble metal. It is preferred to dispose the glass layer partially, not entirely, over the surface of a member, in a preferable manner, for example, in stripes, numerous dots, a lattice pattern, random pattern, and any combinations of these. The partial coverage of the glass layer over the surface of a member is suitable. This local structure can moderate shocks due to thermal impact during cold/heat cycles so that the tube maintains stable performance to shield the magnetic field inside itself.

The intermediate medium can be formed on a member by any of the known methods, which can be selected properly depending on the type of the intermediate medium. To prepare a layer of glass or ceramic in the intermediate medium, a slurry of the ingredients for the layer in a slurry is spray coated, and the ingredients are baked. To prepare a layer of metal a metal foil independently prepared is combined to a member or a layer of glass or ceramic by glass binding, diffusion bonding, or a plasma flame spraying.

Superconductive oxide in the present invention has no particular restriction on materials and can be any of superconductive oxide and its combination such as rare earth superconductive oxides having a multi-layered perovskite structure with a M-Ba-Cu-O system in which M is one or more of the rare earth elements selected from Sc, Y and lanthanides such as La, Eu, Gd, Er, Yb and Lu. Another example are superconductive oxides in a Bi series having such compositions as $Bi_2Sr_2Ca_1Cu_2O_x$ and $Bi_2Sr_2Ca_2Cu_3O_x$.

No particular restriction applies to the thickness of a layer containing superconductive oxide. In general it is preferred to have a thickness of 50 to 2000 $\mu$m after firing. When the thickness is less than 50 $\mu$m, practically the layer is too thin to satisfactorily shield magnetic field. On the contrary when the thickness is larger than 2000 $\mu$m, the difference in temperature in the direction perpendicular to the layer is too large and causes inhomogeneity in superconductive properties in the final product. When metal is used as a member or when the intermediate medium contains a layer of metal, preferably the thickness of a layer containing superconductive oxide after firing ranges from 50 to 500 $\mu$m. Since the heat conductivity of metal is larger than that of superconductive oxide, upon firing the differences in temperatures between the metal and the superconductive oxide become insignificant.

The layer containing superconductive oxide binds onto the intermediate medium by any of known methods such as coating, spraying, and doctor blading. Usually spray coating is applied to the surface of the intermediate medium, followed by sintering at about 800° to about 1200° C. to form a layer containing superconductive oxide.

Then the member with a layer containing superconductive oxide is connected along a joint to another member with the layer. The corresponding intermediate media on the two members are connected along the joint when they are present. Finally, the corresponding layers containing superconductive oxide over the two members are connected.

Figure 16:
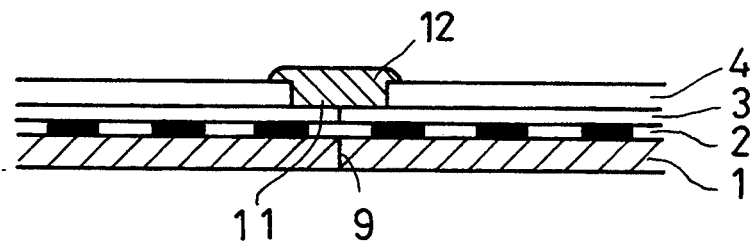
Figure 17:
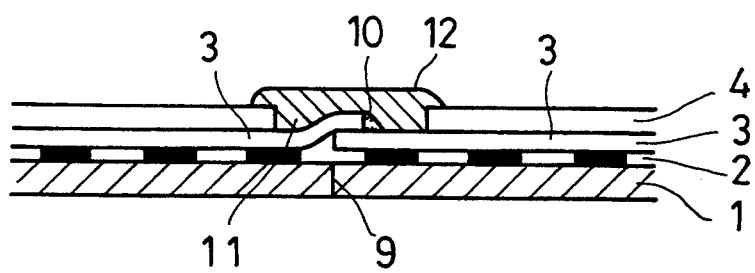

There are numerous variations in members for their shapes, sizes, and the number and types of layers on them, etc. FIGS. 13–19 show typical structures of a laminated member 5 and modes of joining such laminated members. In FIGS. 13–15, 18, and 19 a member 1 includes a flange, and flanged portions 6 of two adjacent members are connected by nuts 7 and a bolt 8. In FIGS. 16 and 17 members do not contain a flange. The joint 9 between two adjacent members abutted against each other is connected by an appropriate method. Typically welding and glass binding are used when the members are made of metal and ceramics, respectively.

Figure 13:
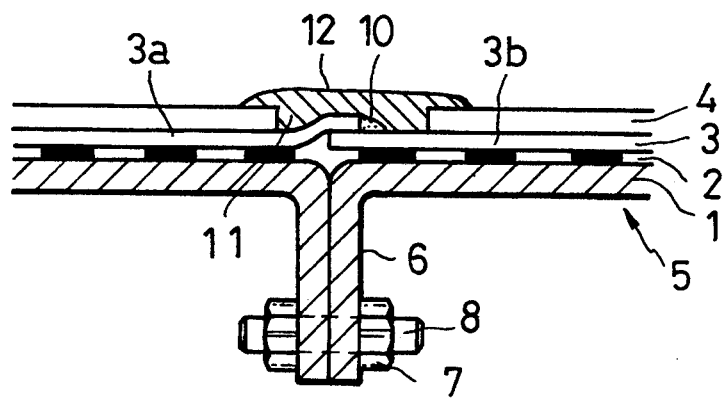
FIG. 13 to FIG. 19 show cross sections of joints between laminated members.
Figure 14:
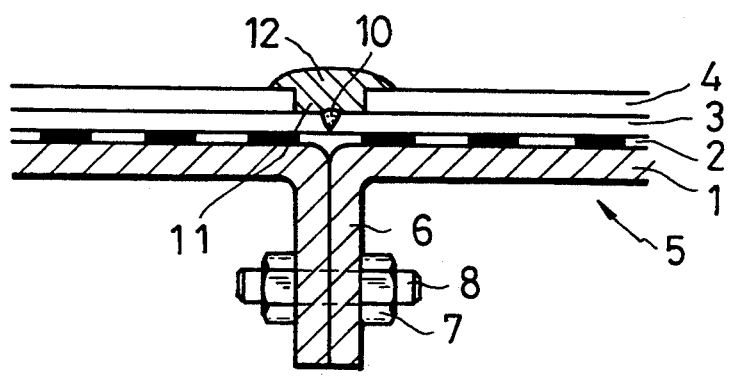
Figure 15:
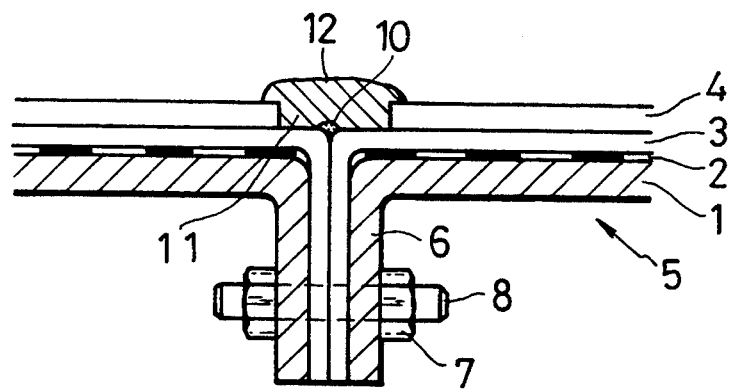
Figure 18:
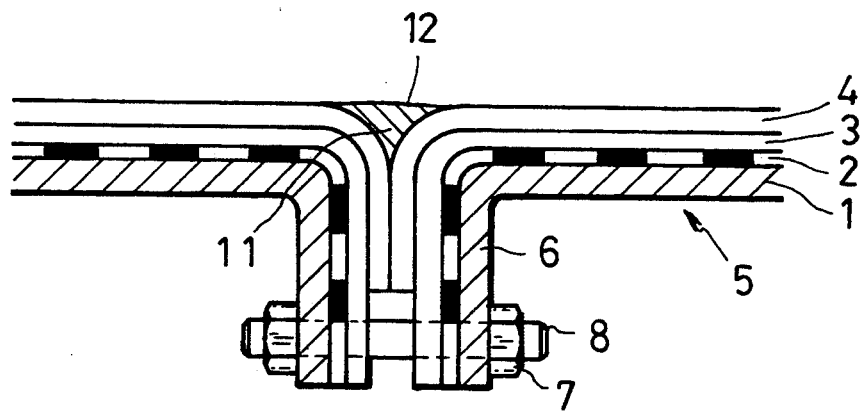
Figure 19:
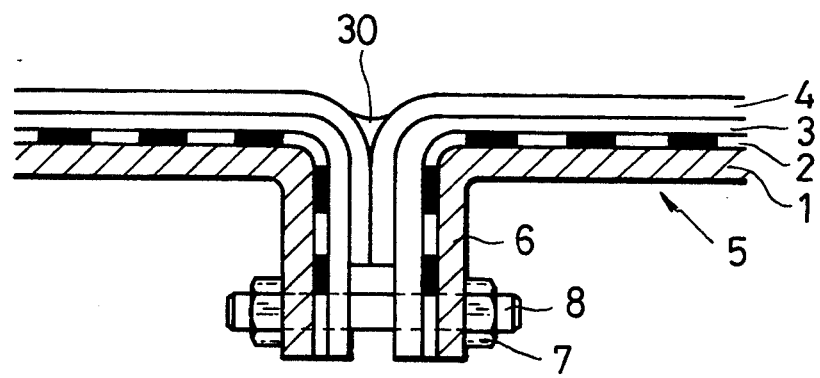

In FIGS. 13 and 14, a flanged portion forms only to a member 1, while in FIG. 15, a flanged portion 6 is present in a member and an Ag plate 3. In FIGS. 18 and 19, a flanged portion 6 is formed with all of a member 1, an intermediate medium (glass layer 2 and Ag plate 3) and a layer containing superconductive oxide 4, and FIGS. 16 and 17 show a case without such a flanged portion 6.

First a member with layers is connected to an adjacent one with layers. Then a layer on one member is connected to another layer on the member. When the laminated members 5 formed as described above are combined and joined into a desired shape, the Ag plate 3 in the intermediate medium is also joined in the same manner as the member 1. In this case, the Ag plate 3 may be joined depending on the mode of joining the member 1.

For instance, in the mode shown in FIGS. 13 and 17, one edge of an Ag plate 3a on one side is extended into above the edge of the Ag plate 3b on the other side to be connected to stack the Ag plates in an area along the joint to make it into a dual structure. Then, a contact 10 between the top end of the upper Ag plate 3a and the lower Ag plate 3b in the dual structure along the joint is joined by welding or by an Ag paste. In FIGS. 14, 15 and 16, two adjacent Ag plates 3 are joined at the contact 10 of the Ag plates 3a by welding or by an Ag paste. When the Ag paste is used to complete connecting the plates, baking was applied between 800° and 900° C. after the coating of the Ag paste.

To connect a layer containing superconductive oxide 4 over a member with the layer containing superconductive oxide over another member in which the former member is joined, firstly a gap 11 between the two layers along the joint of the laminated members has to be filled with materials to become a portion 12 containing superconductive oxide that can be in one application the same as and in another different from the superconductive oxide in the layer containing superconductive oxide. For example, they can be a mixture of starting compounds for a desired oxide in appropriate stoichiometry. Alternatively they can be frit or calcined powders of a desired superconductive oxide.

There are many ways to fill the gap by materials to become a portion 12 containing superconductive oxide between the two adjacent layers containing superconductive oxide, depending on a laminated structure of the two members that have been connected. They are applied by spray coating or brush coating FIGS. 18 and 19 show a local structure along a joint in which the gap between two layers containing superconductive oxide is not necessarily filled by these materials because the two layers containing superconductive oxide are already in contact each other. Without filling the gap an area around the gap can be heated to connect the two layers to result in a dent 30 along the joint as shown in FIG. 19. Alternatively the gap can be filled with appropriate materials to become a superconductive oxide; after heating an area around the gap, the surface around the joint becomes flat (FIG. 18).

Figure 28:
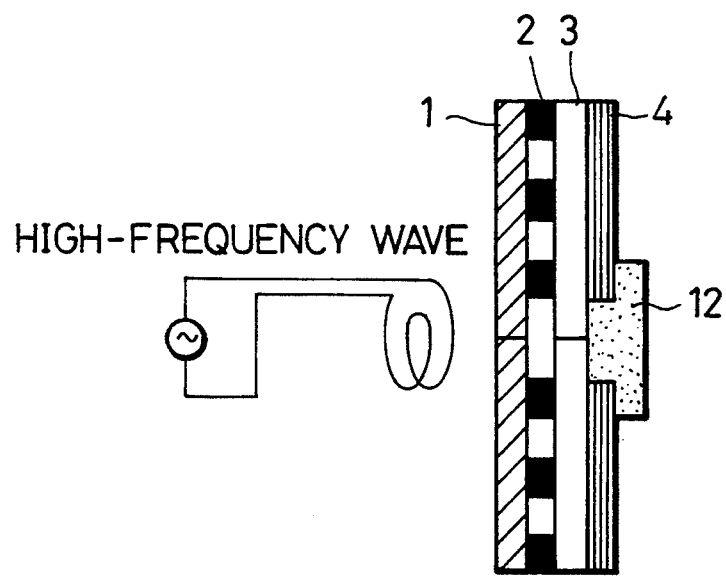

There is no particular restriction on a method for heating a gap 11 to be connected (FIGS. 22–28). Methods for heating an area around the gap include a direct radiation by a heater (FIG. 22), irradiation by a laser beam (FIG. 23), a direct hot blow (FIG. 24), indirect heating due to radiation by a heater from the side of a member 1 (FIG. 25), radiations by heaters from both sides of a member and a layer containing superconductive oxide 4 (FIG. 26), electric heating (FIG. 27), and induction by high-frequency wave (FIG. 28).

Then the materials placed in the gap by one of the methods above between two adjacent layers containing superconductive oxide are fired to form a portion containing superconductive oxide, followed by a heat treatment to grow its crystals of the appropriate phase. By this heat treatment the interface between a layer containing superconductive oxide and a portion containing superconductive oxide become homogeneous. When the superconductive oxide contained in a portion containing superconductive oxide is the same compound as the superconductive oxide contained in a layer containing superconductive oxide, the portion and the layer may become an integral part. It is preferred in many applications that the superconductive oxide contained in a portion containing superconductive oxide is the same compound as the superconductive oxide contained in a layer containing superconductive oxide. In this case appropriate heat treatment is especially preferable which makes a joint along the two layers containing superconductive oxide to be connected homogeneous.

A firing temperature and a temperature range in a heat treatment are adjusted to a type of superconductive oxide formed in a gap between two layers. When frit or calcined powders of $YBa_2Cu_3O_x$ and $Bi_2Sr_2Ca_2Cu_3O_x$ are used to fill a gap between two adjacent layers containing superconductive oxide, ranges of firing temperatures are from 900° C. to 1200° C. and from 830° C. to 860° C., respectively. In either case during firing a sample can be placed under an atmosphere with oxygen content over 20%, favorably over 80%.

Superconductive oxide in a gap between two layers is not restricted to be the same as that of either superconductive oxide contained in a layer to be connected. For example, when frit or calcined powders of $Bi_2Sr_2CaCu_2O_x$ forms upon firing in a gap between two layers containing $Bi_2Sr_2Ca_2Cu_3O_y$, the temperature for firing ranging from 830° C. to 860° C. is much lower than a temperature required for partial melting of $Bi_2Sr_2CaCu_2O_x$. In some applications it is preferable not to melt a layer containing superconductive oxide.

When the superconductive oxide to be formed in a gap between two layers and/or the superconductive oxide in the two layers are mainly $Bi_2Sr_2CaCu_2O_x$, there are two methods for firing and subsequent heat treatment. In one method the surface of a sample is partitioned into two regions, and each region is independently subjected to appropriate temperatures and atmospheres. In the other method a partition is not used and the whole sample is kept in one atmosphere all the time.

In following examples both the superconductive oxide to be formed gap between two layers and the superconductive oxide in the two layers are mainly $Bi_2Sr_2CaCu_2O_x$, thus such experimental conditions as temperatures for firing and for a heat treatment in this section correspond to those for $Bi_2Sr_2CaCu_2O_x$ as superconductive oxide. However, the choice of this particular superconductive oxide should be taken as an example of this present invention, and this invention is not limited as such.

Figure 20A:
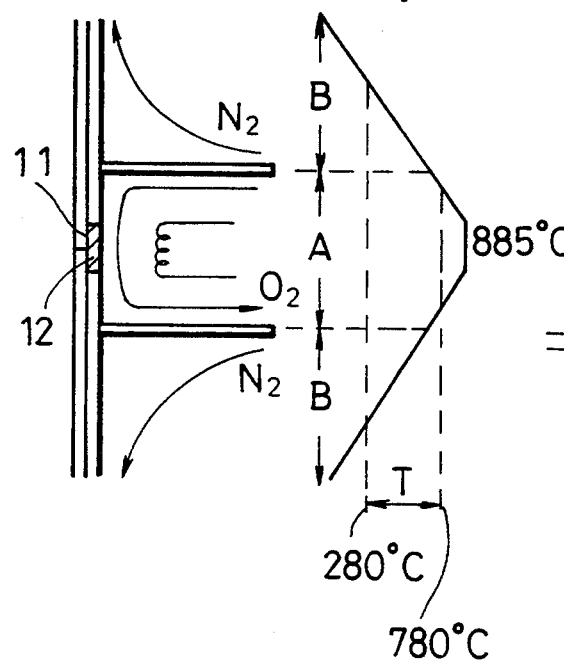
FIG. 20(a), FIG. 20(b), FIG. 21(a), and FIG. 21(b) illustrate a method of controlling an atmosphere during firing a joint to connect the layers in the present invention and during a subsequent heat treatment.
Figure 20B:
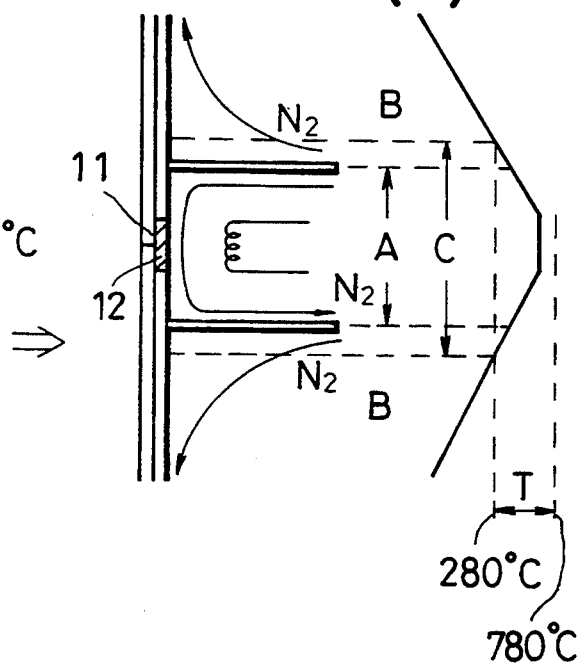
Figure 21A:
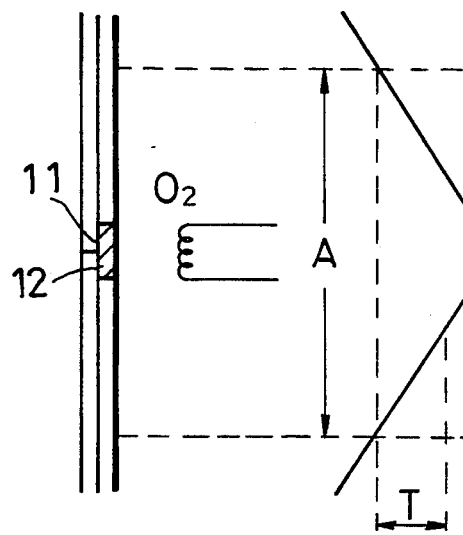

In one method for firing and a subsequent heat treatment regarding $Bi_2Sr_2CaCu_2O_x$, as shown in FIG. 21, no partition is employed, and a whole sample is kept under one atmosphere. In the other method, as shown in FIG. 20, a sample is partitioned into two regions, and each region is controlled in a certain temperature under a certain atmosphere.

In one method for firing and a subsequent heat treatment partition of a sample is not employed, and an entire sample is kept under an atmosphere at one time (FIG. 21).

To fill a gap between two adjacent layers containing superconductive oxide by superconductive oxide, the starting materials in the gap are fired at a temperature between about 875° C. and about 900° C. under an atmosphere with oxygen content over 20%, favorably over 80%, or more favorably over 98%. Such an atmosphere will be referred to as an oxidative atmosphere. On firing the materials to connect the layers, area around the gap is locally heated in any of the methods mentioned before (FIGS. 22–28). In this method without a partition the area with temperatures higher than about 280° C. in this step of firing is loosely defined as region A.

Then the sample is remained to be kept under an oxidative atmosphere for stable growth of crystals formed in the gap upon firing when the highest temperature in the area around the gap is higher than 850° C. or preferably higher than 780° C.

Then the region A is cooled under an atmosphere with oxygen content over 15%, preferably over 20% until the maximum temperature In the region A reaches to 780° C., preferably to 750° C.

Then the temperature and the atmosphere in region A are further changed for a subsequent heat treatment in one of the two ways. In one way first the atmosphere is changed, and then the temperature for a heat treatment is controlled. In another first the temperature for a heat treatment is controlled, and then the atmosphere is changed. Though the two ways tend to give similar results, the former way is sometimes preferable.

Figure 21B:
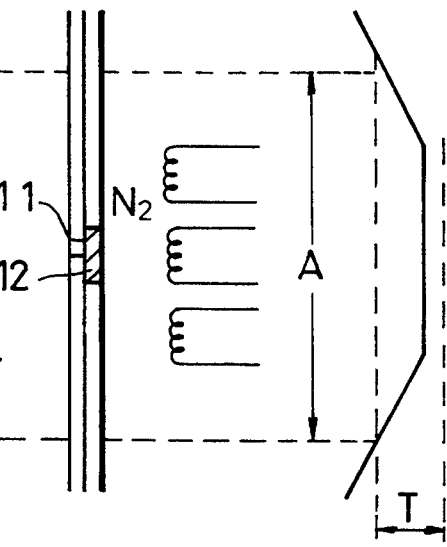

In one way the atmosphere is changed into an atmosphere with oxygen content under 15% or preferably under 3% before the temperature of the region does not change very much. Such an atmosphere will be referred to an inert atmosphere. Then at least all of region A is kept in the temperature range between about 780° C. and about 280° C., preferably between about 750° C. and 450° C. (FIG. 21b). If necessary, the area to be heated in region A to maintain this temperature range is larger than the area heated during firing.

In the other way after the maximum temperature in the region A reaches to 780° C., preferably to 750° C., the temperatures in the region is controlled so that at least all of region A is kept in the temperature range between about 780° C. and about 280° C., preferably between about 750° C. and 450° C. (FIG. 21b). Then the oxidative atmosphere is changed into an inert atmosphere. The sample undergoes a heat treatment in this given temperature range under this atmosphere, followed by cooling it to temperature below 280° C.

During this heat treatment the areas outside region A are optionally kept under an inert atmosphere (FIG. 21b), though this is not required. Temperatures in these areas are not required to be controlled as long as they are lower than the highest temperature in region A. The temperature distribution in these regions is not restricted.

In either method for firing and a subsequent heat treatment with or without a partition, the subsequent heat treatment is not restricted to follow immediately after the firing. As a permissible alternative procedure after firing, region A is cooled down under an oxidative atmosphere to temperature below 280 ° C., then the oxidative atmosphere is changed into an inert atmosphere at this temperature below 280° C., the region is heated to a temperature between 780° C. and 280° C. or preferably between about 750° C. and 450° C., followed by a heat treatment at the temperature under the inert atmosphere, and finally the region is cooled down below 280° C. under the inert atmosphere.

In the other method a using partition for firing and a subsequent treatment frit or calcined powders of $Bi_2Sr_2CaCu_2O_x$ in a gap between two layers containing $Bi_2Sr_2CaCu_2O_x$ are fired at a temperature between about 875° C. and about 900° C. under an oxidative atmosphere, i.e., as defined before an atmosphere with oxygen content over 20%, favorably over 80%, or more favorably over than 98% (FIG. 20a). Temperature distribution inside this region is not restricted as long as this whole region is kept in the temperature range.

During this firing the region in which temperatures are higher than 780° C., preferably higher than 750° C., is partitioned from the other region and kept under the same oxidative atmosphere as that around the gap being fired. Naturally this region, referred to region A, under the oxidative atmosphere includes and is closer to the gap being fired than the other region, referred to region B, in which temperatures are lower than 780° C., or preferably lower than 750 ° C.

During the firing region B, in which temperatures are lower than 780° C. or 750° C., is kept under an inert atmosphere, i.e. an atmosphere with oxygen content under 15% or preferably under 3% (FIG. 20b). The temperature distribution inside region B is not restricted. The partition of the two regions at the temperature of 780° C. is chosen because superconductive oxide in layers begins to decompose at temperatures over 780° C. under an inert atmosphere.

After the firing, the region A is kept under an oxidative atmosphere for stable growth of crystals in the joint as long as Its maximum temperature is higher than 850° C. or preferably 780° C.

Then the region A, including the oxide thus formed in the gap between two layers, is cooled to temperatures lower than 780° C. under an atmosphere with oxygen content over 15%, preferably over 20%. Subsequently its atmosphere is changed into an inert atmosphere, and the region under the inert atmosphere is kept at a temperature range between 780° C. and 280° C., especially between 750° C. and 450° C. (FIG. 20b). In this step part of oxygen in the superconductive oxide of region A is released to the atmosphere. This release of oxygen from the oxide is essential in exerting superconductivity because during firing the superconductive oxide in the whole region A absorbed oxygen under an oxidative atmosphere.

During this heat treatment of region A region B is remained to be kept under an inert atmosphere (FIG. 20b). The release of oxygen from $Bi_2Sr_2CaCu_2O_x$ under an inert atmosphere in this temperature range, i.e. between 780° C. and 280° C. or preferably between 750° C. and 450° C., is reversible, and the oxide can absorb oxygen under an atmosphere rich in oxygen in the same temperature range, which tends to result in too large oxygen composition, leading to deterioration in superconductive properties. $Bi_2Sr_2CaCu_2O_x$ can adsorb oxygen in an atmosphere when it is kept at temperatures higher than 280 ° C. under an atmosphere with oxygen content over 20%. The rate of this oxygen absorption by this oxide under such an atmosphere is markedly accelerated at temperatures higher than 450° C. This is the reason the region B is kept under an inert atmosphere to prevent potential oxygen absorption.

The temperature range of this heat treatment under an inert atmosphere is mainly affected by the stability of and the release of oxygen form the superconductive oxide of region A. The upper limit in the temperature range is 780° C. because of the possible decomposition of superconductive oxide at higher temperatures. Temperatures lower than 750° C. are especially preferred since under this condition possible thermal decomposition of the superconductive oxide becomes more unlikely. The lower limit of the temperature range is 280° C. because at a temperature lower than this the superconductive oxide in the region A does not release oxygen from itself. Especially temperatures higher than 450° C. are preferable since the rate of oxygen release from the oxide in the region A is accelerated.

To place starting materials on surface of a cylindrical tube having either or both of the two restrictions given below and to subsequently fire it, the present inventors have found, leads to unevenness in the thickness of the superconductive layer and/or uneven distribution in superconductive properties that adversely affect satisfactory performance in shielding magnetic field inside itself from outside:

(1) a cylindrical tube with a length in excess of 500 mm, (2) a cylindrical tube having a layer containing superconductive oxide formed on the inner surface and with a ratio of L/D for the length L and inner diameter D of the cylindrical tube of: $L/D \geq 4$.

The present inventors have also found that the unevenness In the thickness of the superconductive layer is mainly caused by difficulty in evenly distributing starting materials over the surface. Particularly it is noted that it is not practically easy to evenly place starting materials to a large tube and to the inner surface of a cylindrical tube with a large ratio of L/D, i.e. a tube with the small diameter or a tube with the long length; here the length of a tube is referred to the height of a tube.

Likewise the uneven distribution in superconductive properties is caused by difficulty in maintaining even temperature distribution over a tube; this problem is especially aggravated by a large tube, for example those satisfying the restriction (1), and a long tube, for example those satisfying the condition (2).

These difficulties lie on a particular form and size of a cylindrical tube, and thus it is overcome by this present invention in which a cylindrical tube is formed by connecting members with a layer containing superconductive oxide. As mentioned before, a size and a shape of a member can be appropriately chosen to prepare an even layer containing superconductive oxide. Therefore, in this invention a tube having either or both of the two restrictions is prepared with satisfactory performance to shield magnetic field.

Moreover, this invention is not restricted to a cylindrical tube having a layer containing superconductive oxide formed on the inner surface. This invention also includes a cylindrical tube having a layer containing superconductive oxide formed on the outer surface and a cylindrical tube having a layer containing superconductive oxide formed on the inner and the outer surfaces.

Furthermore, by a method in this invention a cylindrical tube having a layer containing superconductive oxide formed at the inner surface and with the ratio of $L/D \geq 4$, is prepared much better than by a method in the prior art. Besides, a cylindrical tube having a layer containing superconductive oxide formed at the inner surface and with the ratio of L/D between 2 and 4, is also prepared better than by a method in prior art.

Various modes in combining members into a cylindrical tube are available, and a preferable mode can be chosen depending on its application. The factors to consider for the preferable mode include the purpose of the application, actual conditions of the application, the intermediate medium, superconductive oxide in a layer, methods of binding members, methods of placing the intermediate medium upon the substrate, etc.

Figure 2:
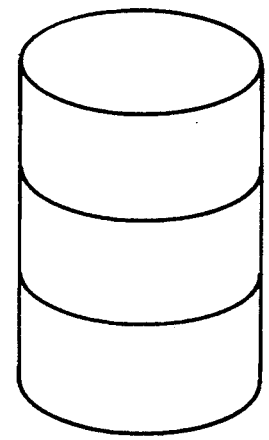

FIGS. 1–8 and 12 illustrate typical modes of combining members into a cylindrical tube. In FIGS. 1 and 2 a cylindrical tube without a member in a bottom plane are shown. In FIGS. 1 and 2 the joints of the members are parallel and perpendicular to the axial direction of the cylindrical tube to be formed, respectively.

Figure 3:
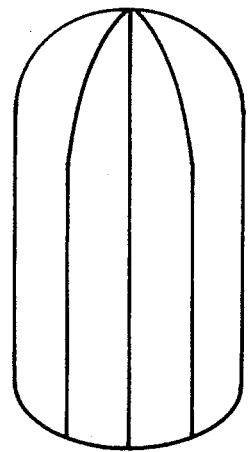
Figure 4:
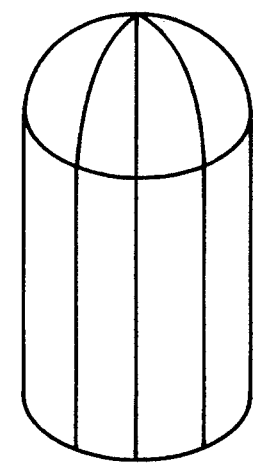
Figure 5:
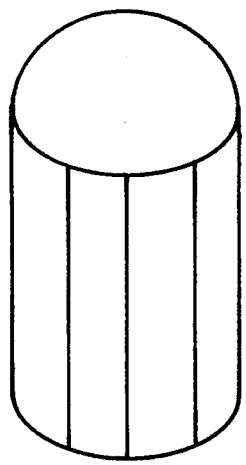

FIGS. 3–8 illustrate a general structure that contains one bottom plane of a cylindrical tube closed; the other bottom plane can be either open or closed. In FIGS. 3–5 the joints of the members are parallel to the axial direction of the cylindrical tube to be formed while in FIGS. 6 and 7 they are perpendicular to the axial direction.

Figure 6:
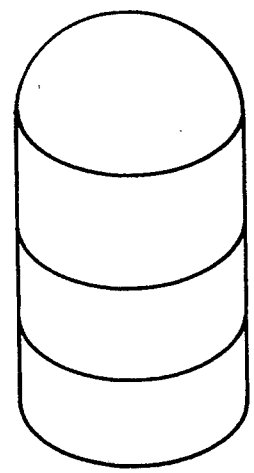
Figure 7:
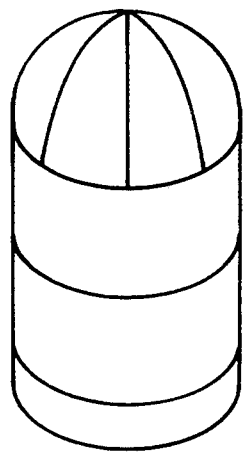

FIGS. 4–7 show an example that the portion for a bottom plane in a cylindrical tube to be formed is independently prepared to the portion for the side in a tube, In FIGS. 4 and 7 the portion for a bottom plane in a tube to be formed is composed of more than two members while in FIGS. 5 and 6 the portion for a bottom plane is composed of only one member. In FIG. 7 the joints in the side portion of a tube to be formed are parallel to the axial direction of the tube while the joints in the portion for a bottom plane are perpendicular to the axial direction of the tube.

Figure 8:
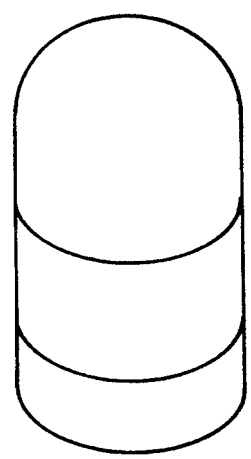

In FIG. 8 one member becomes both the portion for a bottom plane and part of the side portion in a cylindrical tube to be formed.

Figure 11:
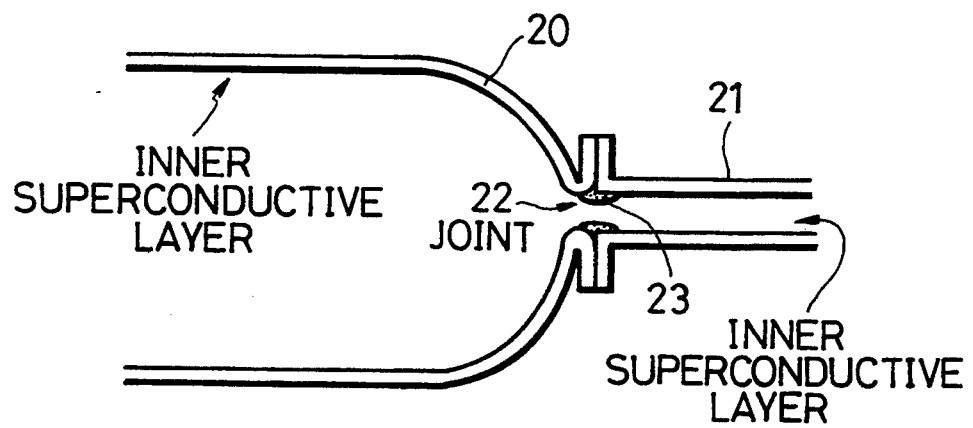
Figure 12:
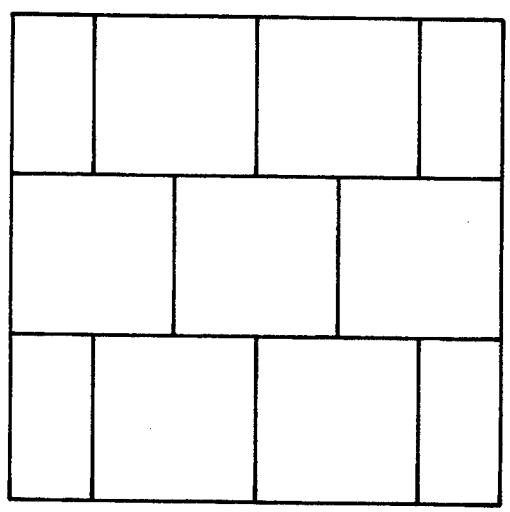
FIG. 12 illustrates a mode of combining flat members into a large-scale flat substrate in the present invention.

FIGS. 9 and 10 show structures of the bottom portion having a small cylinder in a cylindrical tube to be formed, This structure corresponds to a structure that a small cylinder is inserted to the bottom portion in a cylindrical tube as shown in FIG. 5, 6 or 8. FIG. 11 also illustrates the bottom structure with a small cylinder in a cylindrical tube in which a small cylinder is connected to the bottom portion in, for example, FIG. 5, 6 or 8. In these cylindrical tubes with bottom portions having small cylinders, wirings for a sensor or the like can be introduced into the small cylindrical tubes in the bottom portions.

When the superconductive device in the present invention contains bottom members, it is preferable that the bottom members are connected to a rim of the tube with smooth curvature or an angle ranging from 90° to 270°. When a bottom member is connected to a rim of the tube with a right angle or an acute angle, or when the radius of the curvature is less than 5 mm at the connection part of rim, the properties of the tube to shield the magnetic field inside itself significantly deteriorate due to cracks around the connected portion caused by mechanical stress generated by the thermal shock by the cold/heat thermal cycle.

EXAMPLES

The present invention will now be described more in details but it shall not be limited to the following examples.

EXAMPLE 1

Four pieces of a member having flanges at two positions were manufactured out of inconel such that a tube of 500 mm$\phi$ in diameter and 1000 mm in height in the direction parallel to the main axis was formed by combining them along the joints in parallel with the axial direction of the tube as shown in FIG. 1. Each of the member is applied with a surface treatment by sand blasting. Then, except for the flange portion glass slurry was spray coated onto each of the members under masking of a paper tape in a lattice-like pattern each of 30 mm interval, followed by firing between about 800° and about 900° C. for one hour to form a glass layer of a lattice-like pattern with thickness between about 100 and 200 $\mu$m.

Subsequently, Ag foils with thickness of 300 $\mu$m were placed over the glass layer on the inconel member such that the Ag foil extended slightly beyond the side of the flange. Then the glass layer and the Ag foil were bound by heating about 850° and 900° C. for about one hour.

On the Ag layer on the members thus obtained, slurry containing oxides that give upon firing was spray coated, and the resultant tube was heated under oxygen atmosphere between 875° C. and 900° C. for 30 min to form superconductive oxide that is partially melted, followed by gradual cooling down, or annealing, to 850° C. in the rate of 0.5° C./min. They were stood at about 850° C. for 15 hrs to crystallize superconductive oxide on the outermost surface. Then after changing the oxygen atmosphere into that of nitrogen the member was treated at a temperature between about 700° C. and 250° C. for 10 hr to result in the tube coated with superconductive oxide containing Bi with thickness between about 250 to about 350 $\mu$m.

The respective flanges of the four members laminated with the intermediate medium on a member and a layer containing superconductive oxide on the medium, abutted against each other and fixed by bolts and nuts in the mode shown in FIG. 13 to form a cylindrical tube. The contact on the overlapped portion of the Ag foils was connected by welding.

Figure 22:
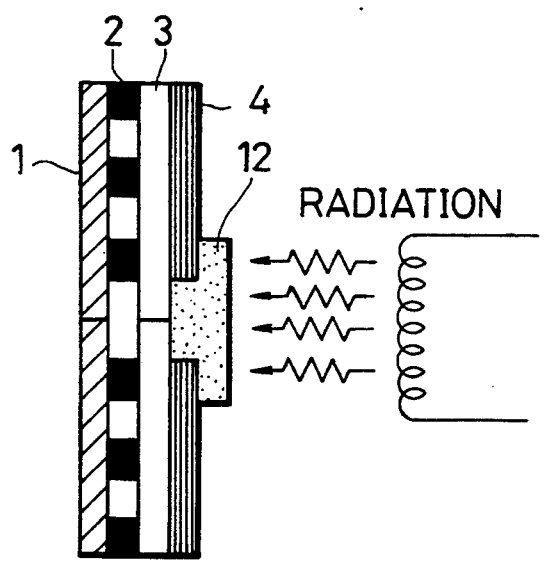
FIG. 22 to FIG. 28 illustrate methods of heating a joint portion.
Figure 23:
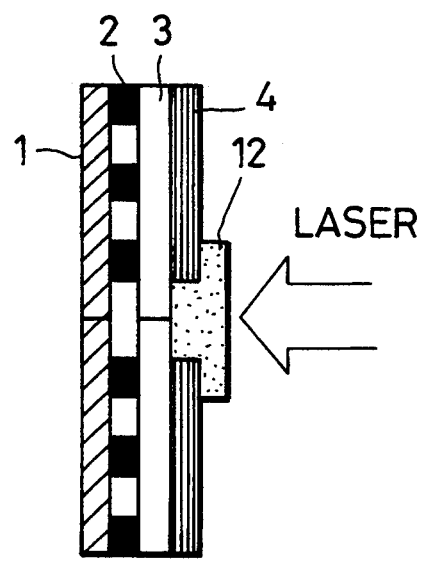
Figure 24:
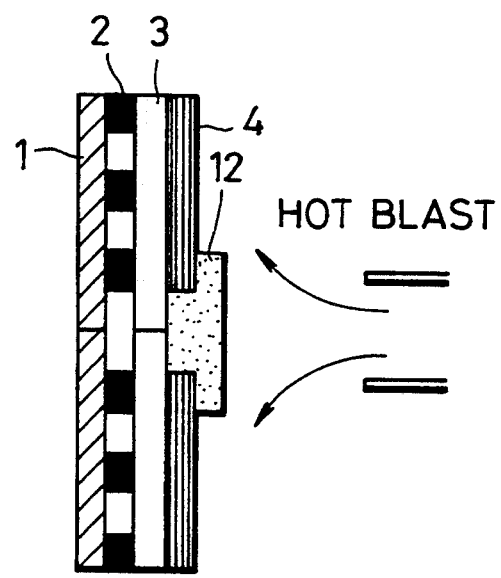
Figure 25:
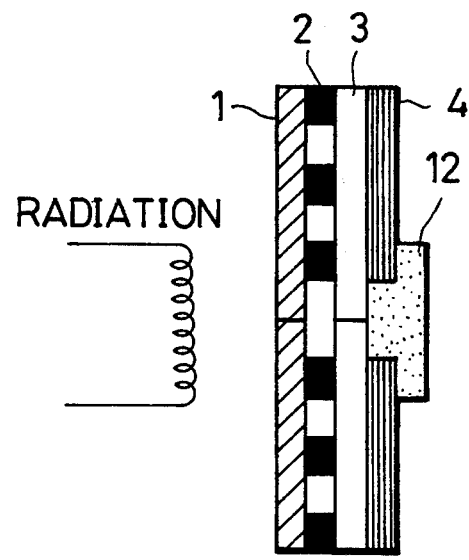
Figure 26:
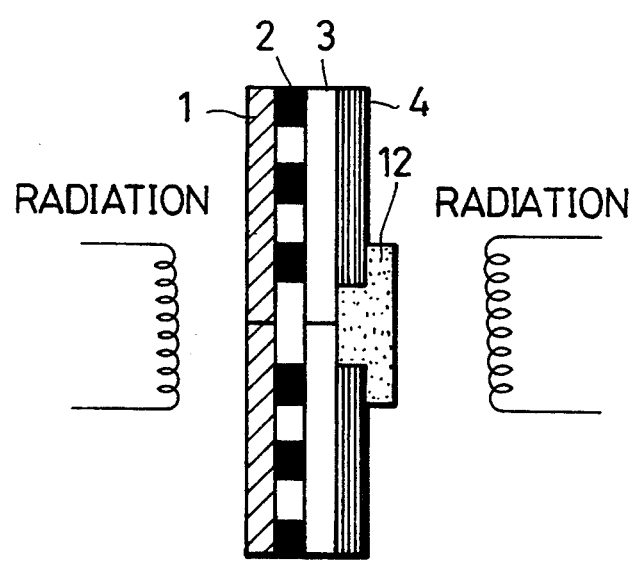
Figure 27:
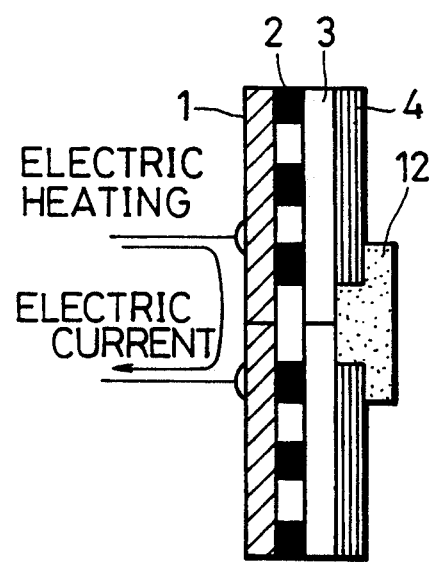

A slurry containing $Bi_2Sr_2Ca_1Cu_2O_x$ was spray coated into each of the gaps between layers containing superconductive oxide along the joints in which the members were connected while the other parts on the surface of the tube were masked. The slurry in the joints were heated by radiation of a heater as shown in FIG. 22 under a method controlling two atmospheres in three areas as shown in FIG. 20. The tube thus obtained has satisfactory appearance by visual observation, and had satisfactory evaluations after cold/heat cycles and local Jc tests. These results are shown in Table 1.

The performance to shield magnetic field inside a tube was measured by a gauss meter situated in a tube while magnetic field outside the tube increased by an electromagnet outside. The magnetic field outside was recorded when the magnetic field inside a tube just began to increase from background.

As evaluation for the cold/heat cycle, the tube at room temperature was first immersed in liquid nitrogen. Then after the temperature of the tube itself was maintained at the liquid nitrogen temperature for 30 min, the performance to shield magnetic field inside itself was measured in the liquid. Subsequently the tube was taken out of the liquid and left at room temperature. After the temperature of the entire tube reached to the room temperature, the tube is left at room temperature for 30 min, and ready for immersing it in liquid nitrogen in the next cycle. This whole process completes one cycle, and five cycles were done.

The performance to shield the magnetic field inside itself from outside at the fifth cycle is compared to that at the first cycle by the following equation and evaluated as "◯" for more than 80% as satisfactory, "Δ" for more than 50% as good, and "x" for less than 50% as failure.

$$\text{evaluation (\%)} = \frac{\text{performance to shield magnetic field at the fifth cold/heat cycle}}{\text{performance to shield magnetic field at the first cold/heat cycle}} \times 100$$

TABLE 1

| Example | Material for member of substance | Device for shielding magnetic field Shape Size | Bi system superconductive layer | Divisional mode | Number of division | Joining Mode Ref. Figure | Substrate | Silver plate | Thickness of silver plate | Heating Method | Firing schedule | Evaluation Appearance | 1 | 2 |
|---|---|---|---|---|---|---|---|---|---|---|---|---|---|---|
| 1 | Inconel | Cylinder $\phi$500 × 1000 mm | Outside | FIG. 1 | 4 | FIG. 13 | Flange | Welding | 300 $\mu$m | FIG. 22 | First | Good | ◯ | ◯ |
| 2 | Inconel | Cylinder $\phi$500 × 1000 mm | Outside | FIG. 1 | 4 | FIG. 14 | Flange | Welding | 300 $\mu$m | FIG. 23 | First | Good | ◯ | ◯ |
| 3 | Inconel | Cylinder $\phi$500 × 1000 mm | Outside | FIG. 1 | 4 | FIG. 17 | Welding | Welding | 300 $\mu$m | FIG. 24 | First | Good | ◯ | ◯ |
| 4 | Inconel | Cylinder $\phi$500 × 1000 mm | Outside | FIG. 1 | 4 | FIG. 16 | Welding | Ag paste | 300 $\mu$m | FIG. 25 | First | Good | ◯ | ◯ |
| 5 | Inconel | Cylinder $\phi$500 × | Inside | FIG. 1 | 4 | FIG. 13 | Flange | Ag paste | 300 $\mu$m | FIG. 26 | First | Good | ◯ | ◯ |

TABLE 1-continued

| Example | Material for member of substance | Device for shielding magnetic field Shape Size | Bi system super-conductive layer | Divisional mode | Number of division | Joining Mode Ref. Figure | Substrate | Silver plate | Thickness of silver plate | Heating Method | Firing schedule | Evaluation Appearance | 1 | 2 |
| --- | --- | --- | --- | --- | --- | --- | --- | --- | --- | --- | --- | --- | --- | --- |
| 6 | Inconel | Cylinder φ500 × 1000 mm | Inside | FIG. 1 | 4 | FIG. 13 | Flange | Welding | 300 μm | FIG. 27 | First | Good | ○ | ○ |
| 7 | Inconel | Cylinder φ500 × 1000 mm | Inside | FIG. 1 | 4 | FIG. 16 | Welding | Welding | 300 μm | FIG. 28 | First | Good | ○ | ○ |
| 8 | Inconel | Cylinder φ500 × 1000 mm | Inside | FIG. 1 | 4 | FIG. 16 | Welding | Ag paste | 300 μm | FIG. 22 | Second | Good | ○ | ○ |
| 9 | Inconel | Cylinder φ500 × 1000 mm | Inside | FIG. 1 | 4 | FIG. 15 | Flange | Welding | 300 μm | FIG. 24 | Second | Good | ○ | ○ |
| 10 | Inconel | Cylinder φ500 × 1000 mm | Inside | FIG. 1 | 4 | FIG. 18 | Flange | Ag paste | 300 μm | FIG. 25 | Second | Good | ○ | ○ |
| 11 | Inconel | Cylinder φ500 × 1000 mm | Outside | FIG. 1 | 4 | FIG. 19 | Flange | Ag paste | 300 μm | FIG. 26 | Second | Good | ○ | ○ |
| 12 | SUS 304 | Cylinder φ500 × 1000 mm | Outside | FIG. 1 | 4 | FIG. 17 | Welding | Welding | 300 μm | FIG. 27 | Second | Good | ○ | ○ |

EXAMPLES 2 to 37

Each of the superconductive tubes for shield magnetic field having or not having bottom portion tubes or flat plates shown in Table 1 was obtained in the same procedures as those in Example 1, with the material for the member, mode of, number of division, mode of connecting members, thickness of the Ag plate in the intermediate medium, heating method for the joined portion, and backing schedule being determined respectively as shown in Table 1 to Table 3. The evaluation was made for the appearance and the cold/heat cycle (evaluation (1) in Table 1 to Table 3) and local Jc evaluation (evaluation (2) in Table 1 to Table 3). The results are shown in Table 1 to Table 3.

Examples 34 to 36 are for the bottomed cylindrical tube each with a small cylinder shown in FIGS. 9, 10 and 11. FIG. 9 show a bottomed cylindrical tube having a layer containing superconductive oxide formed on the outer side and FIG. 10 shows a bottomed cylindrical tube 20 having a layer containing supervonductive oxide formed on the inner side in which a small cylinder 21 is inserted and formed to the bottom of the bottomed cylindrical tube 20. Further, FIG. 11 shows a bottomed cylindrical tube 20 in which a small cylinder 21 is joined to the bottom. In the drawing, 22 represents a joined portion on which a starting material 23 for superconductor is formed by coating.

TABLE 2

| Example | Material for member of substance | Device for shielding magnetic field Shape Size | Bi system super-conductive layer | Divisional mode | Number of division | Joining Mode Ref. Figure | Substrate | Silver plate | Thickness of silver plate | Heating Method | Firing schedule | Evaluation Appearance | 1 | 2 |
| --- | --- | --- | --- | --- | --- | --- | --- | --- | --- | --- | --- | --- | --- | --- |
| 13 | SUS 430 | Cylinder φ500 × 1000 mm | Outside | FIG. 1 | 4 | FIG. 16 | Welding | Ag paste | 300 μm | FIG. 28 | Second | Good | ○ | ○ |
| 14 | SUS 310S | Cylinder φ500 × 1000 mm | Inside | FIG. 1 | 4 | FIG. 13 | Flange | Welding | 300 μm | FIG. 22 | Second | Good | ○ | ○ |
| 15 | Inconel | Bottomed cylinder φ500 × 1000 mm | Outside | FIG. 3 | 4 | FIG. 13 | Flange | Welding | 300 μm | FIG. 22 | Second | Good | ○ | ○ |
| 16 | Inconel | Bottomed cylinder φ500 × 1000 mm | Outside | FIG. 4 | 8 | FIG. 13 | Flange | Welding | 300 μm | FIG. 22 | Second | Good | ○ | ○ |
| 17 | Inconel | Cylinder φ500 × 1000 mm | Inside | FIG. 2 | 2 | FIG. 15 | Flange | Welding | 300 μm | FIG. 22 | Second | Good | ○ | ○ |
| 18 | Inconel | Bottomed cylinder φ500 × 1000 mm | Inside | FIG. 6 | 3 | FIG. 15 | Flange | Welding | 300 μm | FIG. 22 | Second | Good | ○ | ○ |
| 19 | Inconel | Cylinder | Inside | FIG. 1 | 4 | FIG. 15 | Flange | Welding | 300 μm | FIG. 22 | Second | Good | ○ | ○ |

TABLE 2-continued

| Example | Material for member of substance | Device for shielding magnetic field Shape Size | Bi system superconductive layer | Divisional mode | Number of division | Joining Mode Ref. Figure | Substrate | Silver plate | Thickness of silver plate | Heating Method | Firing schedule | Evaluation Apperance | 1 | 2 |
|---|---|---|---|---|---|---|---|---|---|---|---|---|---|---|
| 20 | Inconel | Cylinder φ650 × 2000 mm | Inside | FIG. 2 | 4 | FIG. 15 | Flange | Welding | 300 μm | FIG. 22 | Second | Good | ○ | ○ |
| 21 | Inconel | Bottomed cylinder φ650 × 2000 mm | Inside | FIG. 5 | 5 | FIG. 15 | Flange | Welding | 300 μm | FIG. 23 | First | Good | ○ | ○ |
| 22 | Inconel | Bottomed cylinder φ650 × 2000 mm | Inside | FIG. 7 | 8 | FIG. 16 | Welding | Welding | 300 μm | FIG. 23 | First | Good | ○ | ○ |
| 23 | Inconel | Bottomed cylinder φ650 × 2000 mm | Outside | FIG. 6 | 5 | FIG. 16 | Welding | Welding | 300 μm | FIG. 24 | First | Good | ○ | ○ |
| 24 | Inconel | Cylinder φ800 × 3000 mm | Outside | FIG. 1 | 6 | FIG. 16 | Welding | Welding | 300 μm | FIG. 24 | First | Good | ○ | ○ |

TABLE 3

| Example | Material for member of substance | Device for shielding magnetic field Shape Size | Bi system superconductive layer | Divisional mode | Number of division | Joining Mode Ref. Figure | Substrate | Silver plate | Thickness of silver plate | Heating Method | Firing schedule | Evaluation Apperance | 1 | 2 |
|---|---|---|---|---|---|---|---|---|---|---|---|---|---|---|
| 25 | SUS 430 | Cylinder φ800 × 3000 mm | Inside | FIG. 2 | 6 | FIG. 14 | Flange | Welding | 300 μm | FIG. 24 | First | Good | ○ | ○ |
| 26 | SUS 310S | Cylinder φ800 × 3000 mm | Inside | FIG. 4 | 12 | FIG. 13 | Flange | Welding | 300 μm | FIG. 24 | First | Good | ○ | ○ |
| 27 | Inconel | Cylinder φ800 × 3000 mm | Inside | FIG. 6 | 7 | FIG. 17 | Welding | Welding | 300 μm | FIG. 25 | First | Good | ○ | ○ |
| 28 | Inconel | Cylinder φ800 × 3000 mm | Inside | FIG. 8 | 7 | FIG. 15 | Flange | Welding | 300 μm | FIG. 25 | First | Good | ○ | ○ |
| 29 | Inconel | Cylinder φ1000 × 5000 mm | Inside | FIG. 2 | 10 | FIG. 14 | Flange | Welding | 300 μm | FIG. 22 | First | Good | ○ | ○ |
| 30 | Inconel | Cylinder φ650 × 2000 mm | Outside | FIG. 6 | 5 | FIG. 14 | Flange | Welding | 300 μm | FIG. 22 | First | Good | ○ | ○ |
| 31 | Inconel | Cylinder φ650 × 2000 mm | Inside | FIG. 5 | 5 | FIG. 16 | Welding | Welding | 300 μm | FIG. 22 | First | Good | ○ | ○ |
| 32 | Inconel | Cylinder φ100 × 200 mm | Outside | — | — | — | — | — | 300 μm | — | Integral baking | Good | ○ | ○ |
| 33 | Inconel | Cylinder φ100 × 200 mm | Inside | — | — | — | — | — | 300 μm | — | Integral baking | Good | ○ | ○ |
| 34 | Inconel | Formed by joining Examples 30 and 32 | — | FIG. 9 | 2 | — | — | — | 300 μm | FIG. 22 | First | Good | ○ | ○ |
| 35 | Inconel | Formed by joining Examples 30 and 32 | — | FIG. 10 | 2 | — | — | — | 300 μm | FIG. 22 | First | Good | ○ | ○ |
| 36 | Inconel | Formed by joining Examples 30 and 32 | — | FIG. 11 | 2 | — | — | — | 300 μm | FIG. 22 | First | Good | ○ | ○ |

TABLE 3-continued

| Example | Material for member of substance | Device for shielding magnetic field Shape Size | Bi system superconductive layer | Divisional mode | Number of division | Joining Mode Ref. Figure | Substrate | Silver plate | Thickness of silver plate | Heating Method | Firing schedule | Evaluation Apperance | 1 | 2 |
| --- | --- | --- | --- | --- | --- | --- | --- | --- | --- | --- | --- | --- | --- | --- |
| 37 | Inconel | 900 mm Flat plate φ800 × 3000 mm | — | FIG. 12 | 11 | FIG. 17 | Welding | Welding | 300 μm | FIG. 22 | First | Good | o | o |

COMPARATIVE EXAMPLES 1 to 17

Each of the oxide superconductor magnetic shielding bodies shown in the following Table 4 was obtained in the same procedures as those in Example 1, excepting for integrally forming bottomed or bottomless cylinders or flat plates each comprising a substrate, intermediate medium, composed of a glass layer and a silver layer, placed on the substrate, and a layer containing superconductive oxide. Then, evaluation was made for the appearance and the cold/heat cycle (evaluation (1) in Table 4), local Jc (evaluation (2) in Table 4). The results are shown in Table 4.

As apparent from the foregoing examples and comparative examples, when the small flat plate or the cylindrical tube of a relatively short length, the tubes in the present invention of the examples formed by using members with a laminated structure in which an layer containing superconductive oxide is placed over a member, are excellent in evaluations for the appearance, the cold/heat cycle, and for the local Jc, in time same extent as the integrally formed tube of the comparative examples. However, when the flat plate of a relatively large size or time cylindrical tube of a relatively long length, it can be seen that the evaluations for the appearance, for the cold/heat cycle, and for the local Jc of the tube in the present invention of the examples can be improved as compared with those in the comparative examples.

What is claimed is:

1. A superconductive device for shielding a magnetic field, comprising:
   at least two members, each member having a superconductive layer containing a first superconductive oxide positioned thereon;
   means for connecting said members at a joint to form a substrate;
   means for connecting said superconductive layers along the joint connecting said members to prevent the magnetic field from penetrating the joint;

TABLE 4

| Comparative Example | Device for shielding magnetic field Shape Size | Material for member of substrate | Silver plate | Bi system superconductive layer | Evaluation Appearance | 1 | 2 |
| --- | --- | --- | --- | --- | --- | --- | --- |
| 1 | 300 mm Flat plate | Inconel | 300 μm | — | Good | o | o |
| 2 | 300 mm Flat plate | US 430 | 300 μm | — | Good | o | o |
| 3 | Cylinder φ100 × 400 mm | Inconel | 300 μm | Outside | Good | o | o |
| 4 | Cylinder φ100 × 400 mm | Inconel | 300 μm | Inside | (A) | x | x |
| 5 | Cylinder φ250 × 500 mm | Inconel | 300 μm | Outside | Good | o | o |
| 6 | Cylinder φ250 × 500 mm | Inconel | 300 μm | Inside | (A) | o | Δ |
| 7 | φ500 × 500 mm Cylinder | Inconel | 300 μm | Outside | Good | o | o |
| 8 | φ500 × 500 mm Cylinder | Inconel | 300 μm | Inside | Good | o | o |
| 9 | φ500 × 1000 mm Cylinder | Inconel | 500 μm | Outside | (B) | x | x |
| 10 | φ650 × 2000 mm Cylinder | Inconel | 500 μm | Outside | (B) | x | x |
| 11 | φ650 × 2000 mm Cylinder | Inconel | 500 μm | Inside | (B) | x | x |
| 12 | φ800 × 3000 mm Cylinder | Inconel | 500 μm | Inside | (B) | x | x |
| 13 | φ80 × 500 mm Bottomed cylinder | Inconel | 300 μm | Outside | Good | o | o |
| 14 | φ150 × 450 mm Bottomed cylinder | Inconel | 300 μm | Outside | Good | o | o |
| 15 | 900 mm Flat plate | Inconel | 300 μm | — | (C) | x | x |
| 16 | φ250 × 500 mm Bottomed cylinder | Inconel | 300 μm | Outside | Good | o | o |
| 17 | φ250 × 500 mm Bottomed cylinder | Inconel | 300 μm | Inside | (A) | o | Δ |

(A): Uneven thickness in a layer containing superconductive oxide
(B): Failure in firing around the edges of a tube
(C): Failure in firing in some parts at least two intermediate mediums individually placed between one of said members and one of said superconductive layers, wherein each of said intermediate mediums comprises a noble metal layer which contacts said superconductive layer, and a glass layer placed between said noble metal layer and said member; and means for connecting said intermediate mediums along a joint connecting said members.

2. A superconductive device for shielding a magnetic field as recited in claim 1, wherein said means for connecting said superconductive layers includes at least one portion containing a second superconductive oxide that contacts with end portions of each of said superconductive layers along the joint connecting said members.

3. A superconductive device for shielding a magnetic field as recited in claim 2, wherein said members are connected to form a cylindrical tube.

4. A superconductive device for shielding a magnetic field as recited in claim 3, wherein some joints between said members are parallel with the axial direction of the cylindrical tube formed.

5. A superconductive device for shielding a magnetic field as recited in claim 3, wherein some joints between said members are perpendicular to the axial direction of the cylindrical tube formed.

6. A superconductive device for shielding a magnetic field as recited in claim 3, wherein some joints between said members are slanted relative to the axial direction of the cylindrical tube formed.

7. A superconductive device for shielding a magnetic field as recited in claim 1, wherein said means for connecting said superconductive layers includes at least one portion containing a second superconductive oxide that contacts with end portions of said superconductive layers along every joint connecting said members.

8. A superconductive device for shielding a magnetic field as recited in claim 1, wherein said glass layer, placed between said noble metal layer and said member, partially covers said members.

9. A superconductive device for shielding a magnetic field, comprising:

at least two members, each member having a layer containing a first superconductive oxide positioned thereover;

means for connecting said members at a joint to form a substrate; and means for connecting said superconductive layers along the joint connecting said members to prevent the magnetic field from penetrating the joint, said members being connected to form a cylindrical tube;

wherein one or more of said members are connected to form a bottom member which is connected to a bottom rim of a side portion of the cylindrical tube with an angle ranging from 90 to 270 degrees or a radius of curvature greater than 5 mm between said side and bottom portions.

10. A superconductive device for shielding a magnetic field as recited in claim 9, further comprising:

at least two intermediate mediums individually placed between one of said members and one of said superconductive layers; and means for connecting said intermediate mediums along a joint connecting said members.

11. A superconductive device for shielding a magnetic field as recited in claim 10, wherein each of said intermediate mediums comprises a noble metal layer made of a noble metal.

12. A superconductive device for shielding a magnetic field as recited in claim 11, wherein said noble metal layer contacts with said superconductive layers.

13. A superconductive device for shielding a magnetic field as recited in claim 12, wherein each of said intermediate mediums further comprises a glass layer placed between said noble metal layer and said member.

14. A superconductive device for shielding a magnetic field as recited in claim 13, wherein said glass layer, placed between said noble metal layer and said member, partially covers said member in any size, any shape, or any pattern.

15. A superconductive device for shielding a magnetic field as recited in claim 14, wherein the first superconductive oxide is the same type as the second superconductive oxide.

16. A superconductive device for shielding a magnetic field as recited in claim 15, wherein said first and second superconductive oxides consist essentially of $Bi_2Sr_2CaCu_2O_x$.

17. A superconductive device for shielding a magnetic field as recited in claim 9, wherein said means for connecting said superconductive layers includes at least one portion containing a second superconductive oxide that contacts with end portions of each of said superconductive layers along the joint connecting said members.

18. A superconductive device for shielding a magnetic field as recited in claim 9, wherein some joints between said members are parallel with the axial direction of the cylindrical tube formed.

19. A superconductive device for shielding a magnetic field as recited in claim 9, wherein some joints between said members are perpendicular to the axial direction of the cylindrical tube formed.

* * * * *